United States Patent
Hayat-Dawoodi et al.

(10) Patent No.: US 6,617,846 B2
(45) Date of Patent: Sep. 9, 2003

(54) METHOD AND SYSTEM FOR ISOLATED COUPLING

(75) Inventors: Kambiz Hayat-Dawoodi, Plano, TX (US); Fernando D. Carvajal, Fairview, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/940,934

(22) Filed: Aug. 27, 2001

(65) Prior Publication Data

US 2002/0027488 A1 Mar. 7, 2002

Related U.S. Application Data

(60) Provisional application No. 60/229,575, filed on Aug. 31, 2000.

(51) Int. Cl.[7] ............................. G01B 7/14; G01R 33/06
(52) U.S. Cl. ..................... 324/207.2; 324/251; 327/511
(58) Field of Search .................. 324/207.2, 251; 327/511; 330/6; 257/421

(56) References Cited

U.S. PATENT DOCUMENTS

| 4,292,595 A | 9/1981 | Smith |
| 4,801,883 A * | 1/1989 | Muller et al. ............... 324/252 |
| 5,694,040 A * | 12/1997 | Plagens .................... 324/207.2 |
| 5,831,426 A | 11/1998 | Black, Jr. et al. |

OTHER PUBLICATIONS

Myers, John, et al., "GMR Isolators," *Nonvolatile Electronics, Inc.*, © 1998, pp. 1–7.

* cited by examiner

*Primary Examiner*—Minh Loan Tran
(74) *Attorney, Agent, or Firm*—J. Dennis Moore; W. James Brady, III; Frederick J. Telecky, Jr.

(57) ABSTRACT

A method for isolatively coupling an input signal to an output signal, where the input signal is a first voltage differential, comprises three steps. Step one calls for generating a magnetic field that is indicative of the input signal in at least one magnetic sensor in an integrated circuit by generating a current through a conductor in the integrated circuit. The current is generated by applying the first voltage differential across the conductor, which is proximate the magnetic sensor. Step two requires generating a second voltage differential between two points of the magnetic sensor by providing a current through the magnetic sensor in a direction having a component transverse to the magnetic field. Step three calls for providing a signal indicative of the second voltage differential as the output signal, thereby isolatively coupling the input signal to the output signal.

14 Claims, 3 Drawing Sheets

METHOD AND SYSTEM FOR ISOLATED COUPLING

This application claims priority under 35 USC §119(e)(1) of provisional application Serial No. 60/229,575, filed Aug. 31, 2000.

TECHNICAL FIELD OF THE INVENTION

This invention relates generally to the field of electronics and, more specifically, to a method and system for isolated coupling.

BACKGROUND OF THE INVENTION

Integrated circuits are used for numerous applications. For example, isolation coupling can be accomplished using integrated circuits. Isolation coupling is utilized when two data systems need to communicate with each other, but a physical connection of conductive material is not possible or desired.

There are many desired characteristics for isolation coupling devices or systems. One is that the isolation coupling system accommodates both direct current and alternating current from low to high frequencies. In addition, fast communication speed and higher levels of device integration are also important. Furthermore, users of isolation coupling systems or devices desire systems occupying a small space, while requiring low power consumption and reducing unwanted external and internal effects (i.e. parasitics) to a minimum. It is also desired that isolation coupling systems and devices be produced in a cost-effective manner.

Various systems and devices have been used for isolation coupling. Capacitive coupling using capacitors is one common method. However, a problem with capacitive coupling is that it is very expensive and it cannot accommodate direct current. Another common method for isolation coupling utilizes transformers. Transformers use coils for transferring voltages. A problem with transformers is essentially the same as capacitive coupling in that they are very expensive and cannot handle direct current or low frequency alternating.

An additional method for isolation coupling is optocoupling. Optocouplers use photodiodes in which signals are transmitted by a photon field. A problem with optocouplers is that they are very expensive and can only handle alternating current signals up to approximately ten megahertz. Giant magnetoresistors ("GMRs") are also used for isolation coupling. GMRs use magnetic sensors that utilize a change in resistance to couple two isolated systems. GMRs are not quite as expensive as transformers, capacitive coupling systems, or optocouplers, but they are expensive, and they require magnetic shielding. One of the main reasons they are expensive is the fabrication costs resulting from the many semiconductor fabrication layers required for GMRs.

SUMMARY OF THE INVENTION

The challenges in the field of electronics continue to increase with demands for more and better techniques having greater flexibility and adaptability. Therefore, a need has arisen for a new method and system for isolated coupling.

In accordance with the present invention, a method and system for isolated coupling is provided that addresses disadvantages and problems associated with previously developed methods and systems.

A method for isolatively coupling an input signal to an output signal, where the input signal is a first voltage differential, comprises generating a magnetic field that is indicative of the input signal in at least one magnetic sensor in an integrated circuit by generating a current through a conductor in the integrated circuit. The current is generated by applying the first voltage differential across the conductor, which is proximate the magnetic sensor. A second voltage differential between two points of the magnetic sensor is generated by providing a current through the magnetic sensor in a direction having a component transverse to the magnetic field. A signal, indicative of the second voltage differential, is produced as the output signal, thereby isolatively coupling the input signal to the output signal.

An integrated circuit incorporating an isolation coupler is disclosed. The integrated circuit comprises at least one region of conductive material formed in a semiconductor substrate. The region of conductive material is electrically connected to a plurality of conductive nodes that are operable to allow measurement of a voltage difference arising due to a magnetic field acting on the region of conductive material. The region of conductive material is operable to receive a current from a current source and operable to generate a current through the region of conductive material. At least one isolation layer is disposed outwardly from the semiconductor substrate. A conductive layer is disposed outwardly from the isolation layer, and is operable to receive an input signal and operable to conduct a current to generate the magnetic field.

Embodiments of the invention provide numerous technical advantages. For example, a technical advantage of one embodiment of the present invention is that the single chip, or portion thereof, used for isolated data communication is capable of measurement of direct current ("DC") and alternating current ("AC") from low frequencies up to very high frequencies due parallel path open loop operation. Another technical advantage of one embodiment of the present invention is that the single chip, or portion thereof, has less parasitic capacitance associated with it. An additional technical advantage of one embodiment of the present invention is that the single chip, or portion thereof, is cheaper than previous methods and apparatuses used for isolated coupling.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EMBODIMENTS OF THE INVENTION

Embodiments of the present invention and their advantages are best understood by referring now to FIGS. 1A through 4 of the drawings, in which like numerals refer to like parts.

Figure 1A:
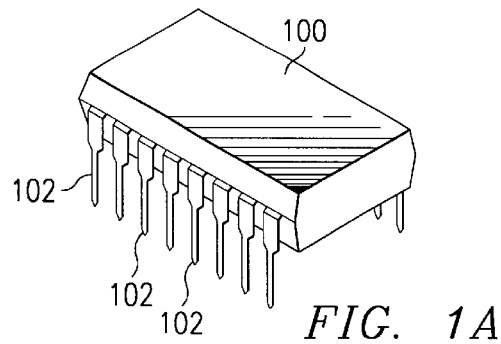
FIG. 1A is a schematic diagram illustrating one embodiment of an integrated circuit that provides isolated coupling in accordance with the present invention.

FIG. 1A is a schematic diagram illustrating one embodiment of an integrated circuit 100 in accordance with the present invention. Integrated circuit 100 is shown to be a dual inline package; however, any type of integrated circuit can be used, such as a quad flat package. Integrated circuit 100 is shown in FIG. 1A to have sixteen pins 102; however, any suitable number of pins can be used such as four or eight. Integrated circuits are used for numerous applications in electronics, and according to the teachings of the invention, one example is a particular type of isolation coupling. Isolation coupling is utilized when two data systems need to communicate with each other, but a physical connection of conductive material is not possible or desired. The present invention provides isolation coupling of two signals by utilizing a monolithic integrated circuit with either or both of a capacitive coupling system 104 and a magnetic coupling system 106, as shown in FIG. 1B.

Figure 1B:
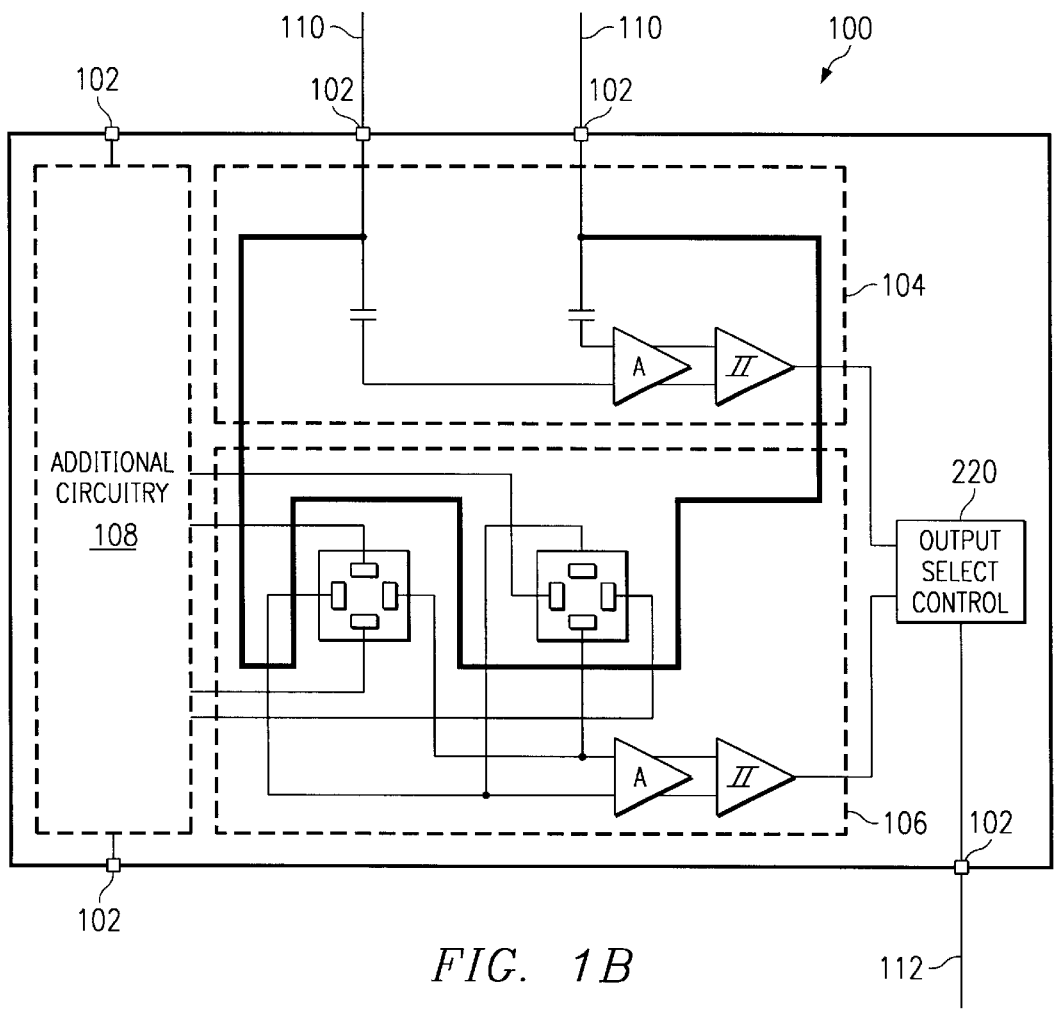
FIG. 1B is a block diagram of the integrated circuit of FIG. 1A, incorporating one embodiment of an isolated coupler in accordance with the present invention.

FIG. 1B is a block diagram of integrated circuit 100 incorporating one embodiment of an isolated coupler in accordance with the present invention. In addition to pins 102, integrated circuit 100 comprises a capacitive coupling system 104, a magnetic coupling system 106, an output select control 220, and additional circuitry 108. In one embodiment, integrated circuit 100 processes an input data signal 110, which is a differential voltage, received at pins 102 and generates an output data signal 112 at another pin 102 without conductively coupling the conductors that carry input data signal 110 and output data signal 112. Rather, as described in greater detail below, these two signals are coupled by a combination of magnetic and capacitive coupling. As indicated above, the present invention accomplishes this by utilizing both capacitive coupling system 104 and magnetic coupling system 106 in parallel on integrated circuit 100. This results in a technical advantage of one embodiment of the present invention in that a monolithic integrated circuit, or portion thereof, is used for isolated data communication that is capable of measurement of both direct current ("DC") and alternating current ("AC") from low frequencies up to very high frequencies due to the parallel path open loop operation. Additional details of capacitive coupling system 104, magnetic coupling system 106, and output select control 220 are described below in conjunction with FIG. 2.

Figure 2:
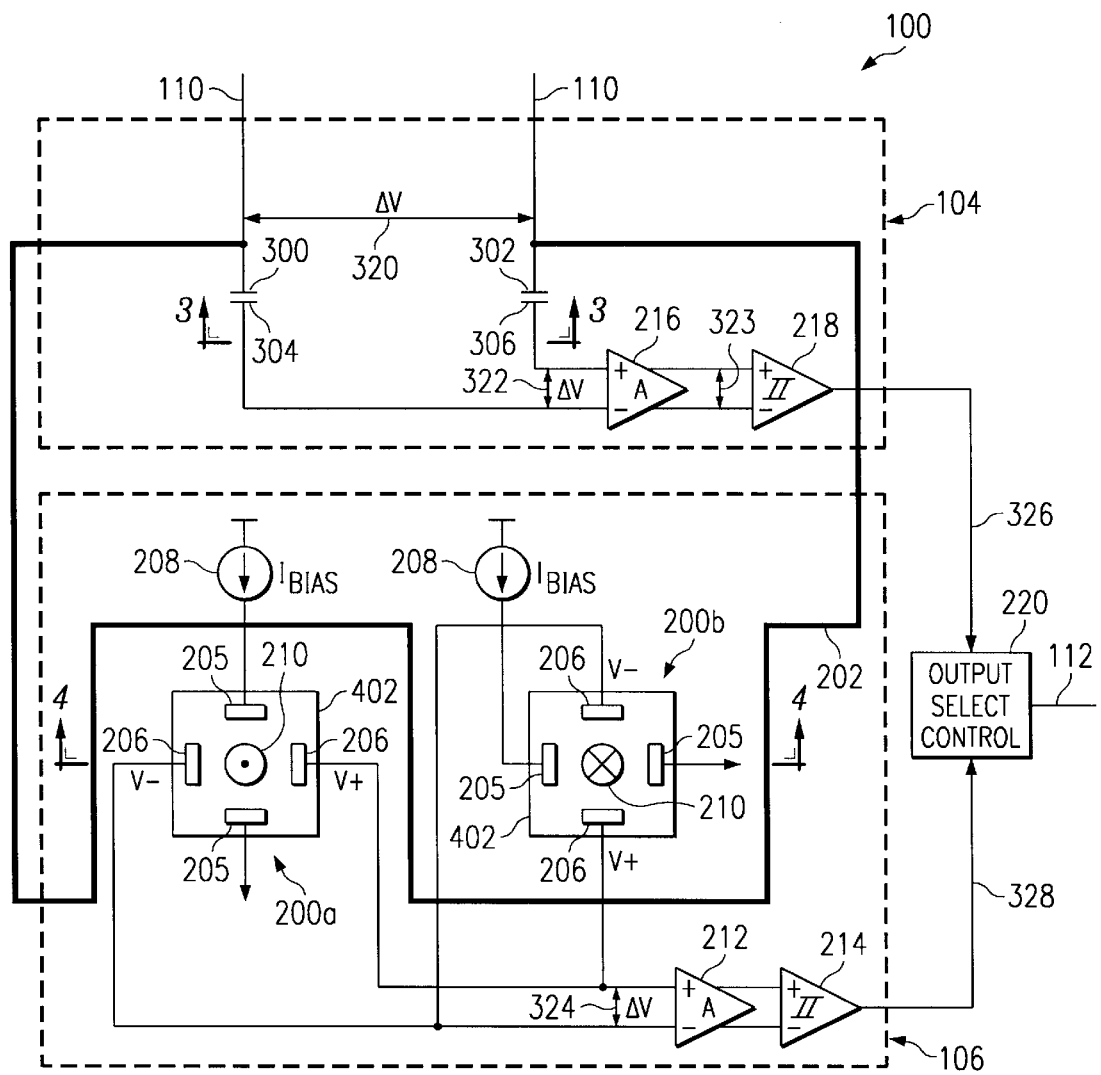
FIG. 2 is a circuit diagram of a portion of the integrated circuit of FIGS. 1A and 1B, showing additional details of the integrated circuit.
Figure 3:
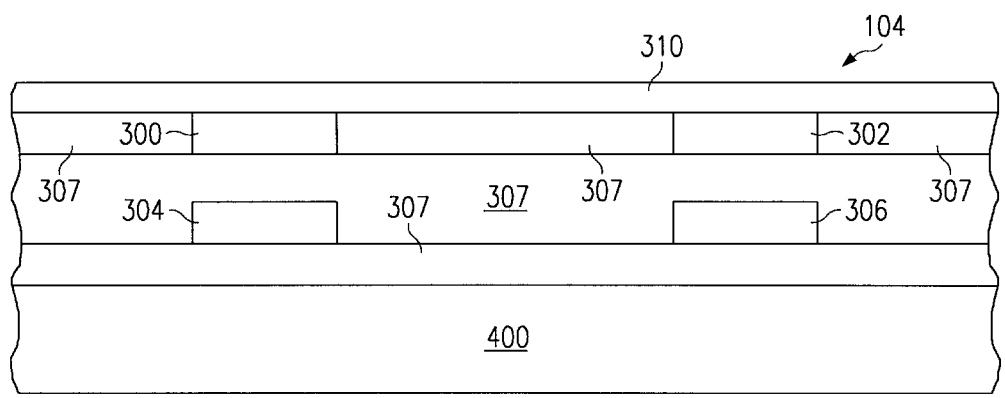
FIG. 3 is a cross-sectional drawing of a portion of the integrated circuit along the lines 3—3 of FIG. 2 illustrating capacitive coupling in accordance with one embodiment of the present invention.
Figure 4:
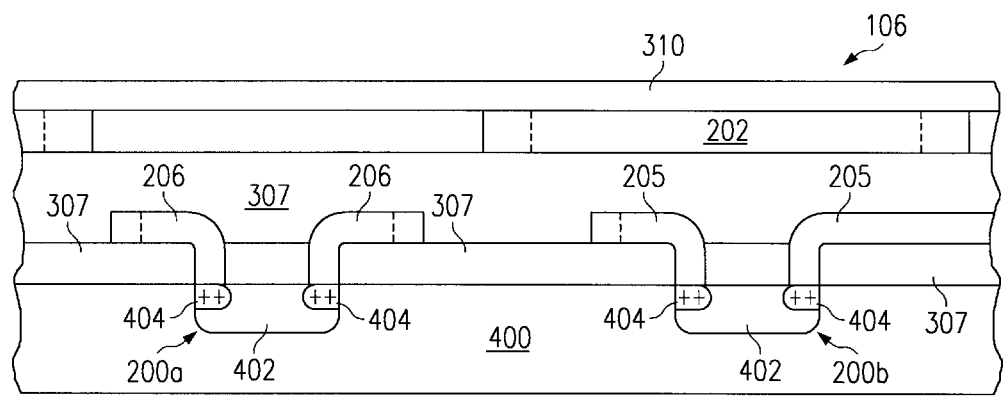
FIG. 4 is a cross-sectional drawing of a portion of the integrated circuit the lines 4—4 of FIG. 2 illustrating magnetic coupling in accordance with one embodiment of the present invention.

FIG. 2 is a schematic diagram of a portion of integrated circuit 100 illustrating capacitive coupling system 104 in parallel with magnetic coupling system 106 in accordance with one embodiment of the present invention, FIG. 3 is a cross-sectional drawing illustrating capacitive coupling system 104 in accordance with one embodiment of the present invention, and FIG. 4 is a cross-sectional drawing illustrating magnetic coupling system 106.

Referring to FIGS. 2 and 3, capacitive coupling system 104 comprises a first conductive plate 300, a second conductive plate 302, a third conductive plate 304, a fourth conductive plate 306, an amplifier 216, and a comparator 218 (shown best in FIG. 2). As shown in the cross-sectional drawing in FIG. 3, capacitive coupling system 104 also includes a substrate 400, an isolation layer 307, and a passivation layer 310. In one embodiment, substrate 400 is a p-type silicon; however, substrate 400 may be other suitable materials used in wafer fabrication of semiconductors. Isolation layer 307, which is disposed outwardly from substrate 400, may comprise for example, one or more dielectric materials such as oxide, nitride, oxynitride, or a heterostructure comprising alternate layers of oxide and nitride. Isolation layer 307 may be one or any number of separate layers depending on the design requirements and fabrication techniques. Passivation layer 310 is a material such as silicon dioxide, silicon nitride, or other suitable materials used for protective layers in semiconductor fabrication. The application of passivation layer 310 is generally a final stage in the semiconductor fabrication process and, if used, provides physical protection for underlying circuits from moisture and other contaminants.

In one embodiment, conductive plates 300, 302, 304 and 306 are regions of conductive material such as an n-well; however, conductive plates 300, 302, 304 and 306 can be other conductive regions such as metal plates. Electrical connections connecting input data signal 110 to first and second conductive plates 300, 302 are not shown in the cross-section of FIG. 3 for clarity. Likewise, the electrical connections of first conductive plate 300 to one end of conductor 202 and second conductive plate 302 to the other end of conductor 202 is not shown for clarity. Furthermore, electrical connections from third and fourth conductive plates 304, 306 to amplifier 216 are not shown in the cross-section of FIG. 3 for clarity purposes.

First conductive plate 300 and second conductive plate 302 receive input data signal 110 through an electrical connection to pins 102. Input data signal 110 is amplified by amplifier 216 and a resulting differential voltage 323 (typically a small mV signal) is provided to comparator 218 for conversion to a digital format. Comparator 218 produces a logic high level at its output when the positive ("+") input is greater than the negative ("−") input, and a logic low level at its output when the positive ("+") input is less than the negative ("−") input. This creates first output data signal 326, which is a large level digital signal with high noise immunity from differential voltage 323 at the inputs to comparator 218. First output data signal 326 is sent to output select control 220. As described below, output select control 220 selects, depending on the frequency of input data signal 110, either or both of first output data signal 326 and an output of magnetic coupling system 106 to generate output data signal 112.

Referring to FIGS. 2 and 4, magnetic coupling system 106 comprises a pair of magnetic sensors 200 (200a and 200b) adjacent to a conductor 202. Magnetic coupling system 106 also includes a current source 208 associated with each magnetic sensor 200, an amplifier 212, and a comparator 214. As described in greater detail below, magnetic sensors 200 detect a magnetic field 210 generated by a current running through conductor 202. Because the current running through conductor 202 is representative of input data signal 110, detected magnetic field 210 is representative of input data signal 110. Magnetic sensors 200 convert detected magnetic field 210 into a differential voltage 324 that is representative of input data signal 110. Amplifier 212 and comparator 214 condition differential voltage 324 to produce a second output data signal 328 that is representative of input data signal 110, thus effecting isolated coupling of input data signal 100 to output data signal 112.

In one embodiment of the present invention, magnetic sensor 200 is a Hall element; however, other types of magnetic sensors can be utilized. A Hall element is a sensing element that takes advantage of the Hall effect. According to the Hall effect, if a magnetic field is applied perpendicular to a conductive region that carries a current, an electric field is produced transverse to that current thus establishing a potential difference commonly referred to as the Hall voltage.

Magnetic sensors 200 each include a pair of conductive nodes 206 between which an induced differential voltage is stored. Magnetic sensors 200 also each include a pair of conductive nodes 205 through which a current supplied by current source 208 is supplied. Magnetic sensor 200 can have any shape desired depending on its intended application. For example, as shown in FIG. 2, magnetic sensor 200 can be generally square or it can be in the shape of a cross, a rectangle, a circle, or other shapes. The size of magnetic sensor 200 can also vary. In the embodiment shown in FIG. 2, magnetic sensor 200 is generally square with a surface area no greater than approximately one thousand square micrometers (1000 $\mu m^2$). As an example, magnetic sensor 200 can have a width of 30 micrometers and a length of 30 micrometers for a total of nine hundred square micrometers (900 $\mu m^2$).

FIG. 2 shows magnetic coupling system 106 having two magnetic sensors 200; however, any number of magnetic sensors 200 may be fabricated in integrated circuit 100, and they can be arranged in any pattern or orientation. A technical advantage arises using two magnetic sensors in that the magnetic sensors cannot be fooled by any magnetic fields generated by any external fields. The external fields will be rejected as they would appear as a common mode signal. In other words, each magnetic sensor will read any external fields as either a positive signal or a negative signal and therefore they would cancel each other out.

FIG. 2 shows two conductive nodes 205 and two conductive nodes 206; however, magnetic sensor 200 may have any number of conductive nodes depending on the design requirements for magnetic sensor 200. Conductive nodes 205, 206 may be coupled to additional circuitry 108 so that, for example, the Hall voltage can be measured. However, one or more conductive nodes 205, 206 may not be coupled to additional circuitry 108 such as, for example, when current source 208 is produced externally.

Conductor 202 may be any type of conductive material such as copper or aluminum. In one embodiment, conductor 202 has a generally right-angled configuration as shown in FIG. 2. However, conductor 202 may have many different types of shapes and patterns as discussed previously.

Current source 208 generates a biased current thereby creating carrier movement through a region of conductive material 402. These carriers are needed because once magnetic field 210 is applied perpendicular to magnetic sensor 200 they are diverted in a direction transverse to the current and, consequently, a voltage difference across magnetic sensor 200 can be measured between contact nodes 206. Current source 208 can be generated on-chip, or can be generated externally. The current generated by current source 208 sends carriers through region of conductive material 402 via conductive nodes 205.

As shown best in FIG. 4, magnetic sensor 200 includes region of conductive material 402 that allows current to flow, thereby creating carriers to be diverted. Region of conductive material 402 may be an n-well (as shown in FIG. 4), or may be other conductive regions such as a metal plate. For clarity, some details of this implementation are not illustrated at corresponding locations in FIG. 2.

According to this embodiment, magnetic sensors 200 of magnetic coupling system 106 are formed in, or overlying, substrate 400, which is also shown in FIG. 3. Region of conductive material 402 (also shown in FIG. 2) is formed in substrate 400. A pair of $n^+$ regions 404 adjacent region of conductive material 402 of magnetic sensor 200a provide enhanced electrical contact between region of conductive material 402 and contact nodes 205, and a second pair of $n^+$ regions 404 adjacent region of conductive material 402 of magnetic sensor 200b provide enhanced electrical contact to contact nodes 205. The pair of $n^+$ regions 404 are created using an implantation process or other doping process to create a highly doped region. An isolation layer 307 is disposed outwardly from substrate 400, conductor 202 is disposed outwardly from isolation layer 307, and passivation layer 310 is disposed outwardly from conductor 202. Isolation layer 307 may consist of one or any number of separate layers, and may comprise one or more dielectric materials such as oxide, nitride, oxynitride or a heterostructure comprising alternative layers of oxide and nitride. Electrical connections to amplifier 212 are not shown in FIG. 4 for clarity purposes.

The operation of one example of isolation coupling in accordance with the present invention is described below in conjunction with FIGS. 2 through 4. As shown in FIG. 2, capacitive coupling system 104 and magnetic coupling system 106 are utilized in parallel in integrated circuit 100 to isolatively couple input signal 110 to output signal 112. Capacitive coupling system 104 looks for edge detection and therefore accommodates high frequency signals, and magnetic coupling system 106 accommodates both DC and AC from low to high frequencies.

In the capacitive coupling parallel path, input data signal 110 is received by first conductive plate 300 and second conductive plate 302 (FIG. 3) thereby causing a first differential voltage 320. First differential voltage 320 is capacitively coupled to second differential voltage 322 using conductive plates 300, 302, 304 and 306. Second differential voltage 322 is supplied to amplifier 216, which amplifies second differential voltage 322 and provides resulting differential voltage 323 to comparator 218. Comparator 218 conditions resulting differential voltage 323 and generates a first output signal 326, which is representative of input data signal 110.

In the magnetic coupling parallel path, first differential voltage 320 generates a current through conductor 202. Conductor 202 is positioned proximate magnetic sensors 200a, 200b as shown in FIG. 2. Magnetic sensors 200a, 200b detect magnetic field 210 generated by the current running through conductor 202. Because the current running through conductor 202 is representative of input data signal 110, detected magnetic field 210 is representative of input data signal 110. Magnetic sensors 200a, 200b convert detected magnetic field 210 into a differential voltage 324 (FIG. 2) that is representative of input data signal 110. Amplifier 212 and comparator 214 condition differential voltage 324 to generate second output data signal 328 that is representative of input data signal 110. Output data signal 112 is then selected from first output data signal 326 and second output data signal 328 thereby completing the isolation coupling.

Although an embodiment of the invention and its advantages are described in detail, a person skilled in the art could make various alternations, additions, and omissions without departing from the spirit and scope of the present invention as defined by the appended claims.

What is claimed is:

1. A method for isolatively coupling an input signal to an output signal, the input signal being a first voltage differential, the method comprising:

generating a magnetic field that is indicative of the input signal in at least one magnetic sensor in an integrated circuit by generating a current through a conductor in the integrated circuit, the current generated by applying the first voltage differential across the conductor, the conductor being disposed proximate the magnetic sensor;

generating a second voltage differential between two points of the magnetic sensor by providing a current through the magnetic sensor in a direction having a component transverse to the magnetic field; and providing a signal indicative of the second voltage differential as the output signal, thereby isolatively coupling the input signal to the output signal.

2. The method of claim 1 further comprising:

capacitively coupling the first voltage differential to a third voltage differential to produce a second signal indicative of the third voltage differential; and selecting the output signal chosen from the group consisting of the signal and the second signal based on the frequency of the input signal.

3. The method of claim 1 wherein the magnetic sensor is a Hall element.

4. The method of claim 3 wherein the Hall element comprises an n-well formed in a semiconductor substrate.

5. The method of claim 1 wherein the conductor is copper.

6. The method of claim 1 further comprising arranging the conductor such that the magnetic field generated by the conductor produces a negative voltage difference on a first magnetic sensor and a positive voltage difference on a second magnetic sensor.

7. The method of claim 1 further comprising manufacturing the magnetic sensor with a surface area less than approximately 1000 $\mu m^2$.

8. A method for isolatively coupling an input signal to an output signal in an integrated circuit, the method comprising:

providing first and second conductive plates operable to receive the input data signal;

providing at least one magnetic sensor having a region of conductive material, the magnetic sensor operable to receive a current from a current source and to conduct the current through the region of conductive material;

electrically connecting a plurality of conductive nodes to the conductive material, the conductive nodes operable to allow measurement of a voltage difference arising due to a magnetic field acting on the region of conductive material;

electrically connecting a conductor at one end to the first conductive plate and electrically connecting the other end to the second conductive plate;

positioning the conductor proximate the magnetic sensor, the conductor operable to conduct a current generated by the input signal thereby generating the magnetic field;

receiving the input signal resulting in a first differential voltage between the first and second conductive plates;

capacitively coupling the first differential voltage to a second differential voltage along a first parallel path to produce a first output signal representative of the input signal using a first amplifier and a first comparator;

magnetically coupling the first differential voltage to a third differential voltage along a second parallel path to produce a second output signal representative of the input signal by measuring the voltage difference across the magnetic sensor due to the magnetic field generated by the current produced by the first voltage differential and producing a second output signal representative of the input signal using a second amplifier and a second comparator; and creating an output signal chosen from the group consisting of the first output signal and the second output signal.

9. The method of claim 8 wherein the magnetic sensor is a Hall element.

10. The method of claim 8 wherein the region of conductive material comprises an n-well formed in a semiconductor substrate.

11. The method of claim 8 wherein the conductor is copper.

12. The method of claim 8 wherein providing at least one magnetic sensor comprises providing two magnetic sensors, wherein the conductor is arranged such that the magnetic field generated by the conductor produces a negative voltage difference on one of the magnetic sensors and a positive voltage difference on the other magnetic sensor.

13. The method of claim 8 further comprising manufacturing the magnetic sensor with a surface area less than approximately 1000 $\mu m^2$.

14. The method of claim 8 wherein capacitively coupling comprises the first and second conductive plates being separated from third and fourth conductive plates by an isolation layer, wherein the third and fourth conductive plates are electrically connected to the first amplifier.

* * * * *